US009660114B2

(12) United States Patent
Loiseau et al.

(10) Patent No.: US 9,660,114 B2
(45) Date of Patent: May 23, 2017

(54) TEMPERATURE STABILIZATION OF AN ON-CHIP TEMPERATURE-SENSITIVE ELEMENT

(71) Applicant: International Business Machines Corporation, Armonk, NY (US)

(72) Inventors: Alain Loiseau, Williston, VT (US); Andreas D. Stricker, Milpitas, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/749,798

(22) Filed: Jun. 25, 2015

(65) Prior Publication Data
US 2016/0380637 A1    Dec. 29, 2016

(51) Int. Cl.
*H01L 31/024*   (2014.01)
*G01J 5/06*     (2006.01)

(52) U.S. Cl.
CPC ............ *H01L 31/024* (2013.01); *G01J 5/061* (2013.01); *G01J 2005/062* (2013.01); *G01J 2005/063* (2013.01)

(58) Field of Classification Search
CPC .......... G01J 2005/061–2005/063; G01J 5/061; H01L 31/024
See application file for complete search history.

(56) References Cited

U.S. PATENT DOCUMENTS

| 4,525,663 | A | 6/1985 | Henry |
| 5,137,370 | A | 8/1992 | McCulloch et al. |
| 5,465,039 | A | 11/1995 | Narita et al. |
| 5,949,279 | A | 9/1999 | Kwan |
| 6,055,252 | A | 4/2000 | Zhang |
| 6,212,210 | B1* | 4/2001 | Serizawa ............... H01S 5/0687 372/29.02 |
| 6,525,550 | B2* | 2/2003 | Pan ....................... G05D 23/306 165/290 |
| 6,815,643 | B2 | 11/2004 | Der Ropp |
| 6,816,665 | B2 | 11/2004 | Shani et al. |
| 7,626,448 | B2 | 12/2009 | Byeon et al. |
| 7,673,508 | B2* | 3/2010 | Sakuma ................. G01F 1/6845 73/204.26 |

(Continued)

Primary Examiner — Thomas J Hiltunen
(74) Attorney, Agent, or Firm — Gibb & Riley, LLC; Steven J. Meyers

(57) ABSTRACT

Disclosed is an integrated circuit (IC) chip incorporating a temperature-sensitive element and temperature stabilization circuitry for ensuring that the temperature of the temperature-sensitive element (TSE) remains essentially constant. The IC chip comprises a temperature-sensitive element and, within at least one region adjacent to the temperature-sensitive element, a first circuit that radiates a first heat amount to the TSE and a second circuit that radiates a second heat amount to the TSE. The second circuit senses changes in a first current amount in the first circuit and, thereby changes in the first heat amount. In response to those changes, the second circuit also automatically adjusts a second current amount in the second circuit and, thereby the second heat amount in order to ensure that the total heat amount radiated by the first circuit and the second circuit, in combination, to the TSE remains constant. Also disclosed is an associated method.

20 Claims, 7 Drawing Sheets

(56) References Cited

U.S. PATENT DOCUMENTS

| | | | | |
|---|---|---|---|---|
| 7,750,287 B2* | 7/2010 | Okamoto | ............... | G05D 23/27 |
| | | | | 250/238 |
| 7,980,084 B2* | 7/2011 | Okamoto | ............... | F25B 21/02 |
| | | | | 62/3.7 |
| 8,174,197 B2 | 5/2012 | Ghanem et al. | | |
| 8,624,675 B2 | 1/2014 | Lautzenhiser | | |
| 8,907,254 B2* | 12/2014 | Sakagami | ............... | C23C 16/46 |
| | | | | 118/725 |
| 9,031,440 B2* | 5/2015 | Fujiwara | ............ | G03G 15/2039 |
| | | | | 219/494 |
| 9,232,315 B2* | 1/2016 | Martin | ................... | H04R 17/00 |
| 2014/0260541 A1* | 9/2014 | Lakhotia | ................ | G01N 27/12 |
| | | | | 73/25.05 |
| 2016/0006212 A1* | 1/2016 | Uesaka | ................ | H01S 5/0607 |
| | | | | 372/20 |

* cited by examiner $W_{402}=xW_{401}=W_{404}=xW_{405}$ $I_T=I_{1C}+I_{2C}$ $I_{2C}=I_{1C}/x+(I_{REF}-I_{1C}/x)+x*I_{REF}-I_{1C}$ $I_T=I_{1C} + [I_{1C}/x+(I_{REF}-I_{1C}/x)+x*I_{REF}-I_{1C}] =(x+1)I_{REF}$ $x-1 = W_{503}/W_{502}$ $I_T = I_{1C\text{-}MAX} + (x-1)(I_{1C\text{-}MAX} - I_{1C})$ $I_T = I_{1C} + x(I_{1C\text{-}MAX} - I_{1C})$

TEMPERATURE STABILIZATION OF AN ON-CHIP TEMPERATURE-SENSITIVE ELEMENT

BACKGROUND

The present invention relates to temperature-sensitive elements on integrated circuit (IC) chips and, more specifically, to IC chips configured to provide temperature stabilization to temperature-sensitive elements and methods for stabilizing the temperature of such temperature-sensitive elements.

Oftentimes an integrated circuit (IC) chip will incorporate temperature-sensitive elements (e.g., temperature-sensitive devices or temperature-sensitive circuits) that can exhibit variations in one or more performance attributes as a function of temperature variations. Such temperature-sensitive elements include, but are not limited to, photonic devices and opto-electronic devices. Temperature variations of a temperature-sensitive element can be due to thermal coupling with one or more adjacent circuits. Specifically, the amount of heat radiated by components of the adjacent circuit(s) can vary, for example, as a function of operational changes (e.g., changes in frequency, data rate, etc.) and/or degradation over time and such variations in the amount of radiated heat can cause corresponding variations in the temperature of the temperature-sensitive element. In some applications, however, it is important that the performance attribute(s) of a temperature-sensitive element remain constant. Feedback techniques are typically used to control the temperature of a temperature-sensitive element and, thereby to control the value of the performance attribute of the temperature-sensitive element. For example, the temperature of the temperature-sensitive element can be sensed and, when that temperature increases above a predetermined threshold temperature, one or more actions can be taken (e.g., reducing the supply voltage to adjacent circuit(s), reducing the frequency of operation of the adjacent circuit (s), etc.) in order to reduce the temperature. Unfortunately, such feedback techniques effectively result in an oscillating temperature as opposed to a constant temperature. Therefore, there is a need in the art for an improved temperature control technique, which ensures that the temperature of a temperature-sensitive element on an integrated circuit (IC) chip remains constant throughout the useful life of that IC chip.

SUMMARY

Disclosed herein is an embodiment of an integrated circuit (IC) chip. This IC chip can comprise a temperature-sensitive element. The IC chip can further comprise, within a region adjacent to the temperature-sensitive element, a first circuit (e.g., a functional circuit) and a second circuit (e.g., a temperature stabilization circuit) adjacent to the first circuit. The first circuit and second circuit can each be thermally coupled to the temperature-sensitive element.

The second circuit can sense changes in a first current amount in the first circuit and, in response to such changes, can automatically adjust a second current amount in the second circuit. Specifically, the first circuit can radiate a first heat amount to the temperature-sensitive element (i.e., can transfer a first heat amount to the temperature-sensitive element) and this first heat amount can vary with variations in a first current amount that passes through the first circuit. Similarly, the second circuit can radiate a second heat amount to the temperature-sensitive element (i.e., can transfer a second heat amount to the temperature-sensitive element) and this second heat amount can vary with variations in a second current amount in the second circuit. The second circuit can be operably connected to the first circuit and can sense changes in the first current amount that will cause changes in the first heat amount radiated by the first circuit to the temperature-sensitive element. Furthermore, in response to any changes sensed in the first current amount, the second circuit can automatically adjust the second current amount and, thereby can automatically adjust the second heat amount radiated to the temperature-sensitive element in order to ensure that the total heat amount radiated by the first circuit and the second circuit to the temperature-sensitive element, in combination, remains constant.

In another embodiment of the integrated circuit (IC) chip, there can be multiple circuit-containing regions adjacent to the temperature-sensitive element and each of these regions can incorporate a functional circuit and a temperature stabilization circuit. That is, also disclosed herein is an embodiment of an IC chip that comprises a temperature-sensitive element and pairs of circuits in different circuit-containing regions adjacent the temperature-sensitive element. Each pair can comprise a first circuit (e.g., a functional circuit) and a second circuit (e.g., a temperature stabilization circuit) adjacent to the first circuit. The first circuit and second circuit can each be thermally coupled to the temperature-sensitive element.

Within each pair, the second circuit can sense changes in a first current amount in the first circuit and, in response to such changes, can automatically adjust a second current amount in the second circuit. Specifically, the first circuit can radiate a first heat amount to the temperature-sensitive element (i.e., can transfer a first heat amount to the temperature-sensitive element) and that first heat amount can vary with variations in a first current amount that passes through the first circuit. Similarly, the second circuit can radiate a second heat amount to the temperature-sensitive element (i.e., can transfer a second heat amount to the temperature-sensitive element) and the second heat amount can vary with variations in a second current amount in the second circuit. The second circuit can be operably connected to the first circuit and can sense changes in the first current amount that will cause changes in the first heat amount radiated by the first circuit to the temperature-sensitive element. Furthermore, in response to any changes sensed in the first current amount, the second circuit can automatically adjust the second current amount and, thereby can automatically adjust the second heat amount radiated to the temperature-sensitive element in order to ensure that the total heat amount radiated by the first circuit and the second circuit to the temperature-sensitive element, in combination, remains constant.

Also disclosed herein are embodiments of a method for stabilizing the temperature of an on-chip temperature-sensitive element. The method can comprise providing an integrated circuit (IC) chip comprising a temperature-sensitive element and, within each of one or more circuit-containing regions adjacent to the temperature-sensitive element, a pair of circuits. Each pair can comprise a first circuit (e.g., a functional circuit) and a second circuit (e.g., a temperature stabilization circuit) adjacent to the first circuit. The first circuit and second circuit can each be thermally coupled to the temperature-sensitive element.

For each pair, the method can comprise sensing, by the second circuit, changes in a first current amount in the first circuit and, in response to any changes sensed in the first current amount, automatically adjusting, by the second circuit, a second current amount in the second circuit. Specifically, the first circuit can radiate a first heat amount to the temperature-sensitive element that varies with variations in a first current amount through the first circuit. Thus, the method can comprise sensing, by the second circuit, any changes in the first current amount that will cause changes in the first heat amount. Additionally, the second circuit can radiate a second heat amount to the temperature-sensitive element and this second heat amount can vary with variations in the second current amount in the second circuit. Thus, the method can further comprise, in response to any changes sensed in the first current amount, automatically adjusting, by the second circuit, the second current amount and, thereby automatically adjusting the second heat amount radiated to the temperature-sensitive element in order to ensure that the total heat amount radiated by the first circuit and the second circuit to the temperature-sensitive element, in combination, remains constant.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
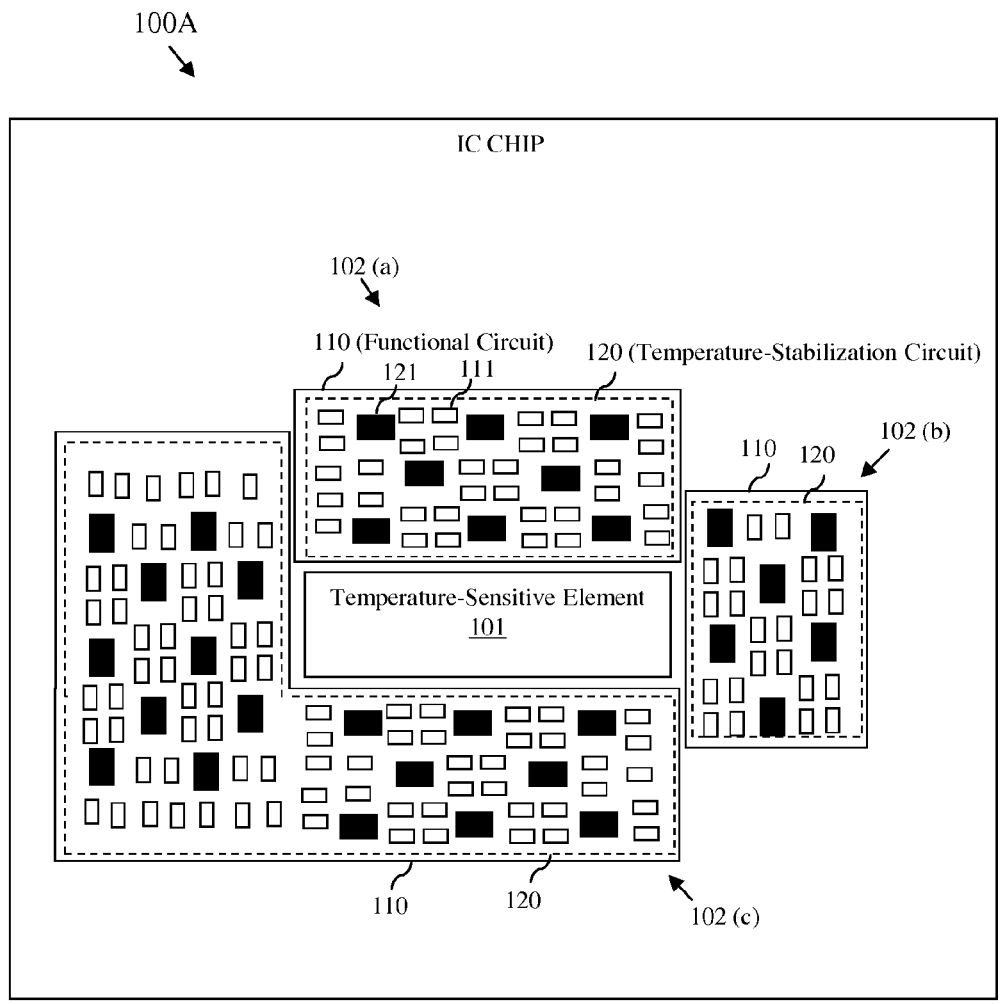
FIG. 1A is a schematic diagram illustrating an integrated circuit (IC) chip configured to provide temperature stabilization to a temperature-sensitive element.

As mentioned above, oftentimes an integrated circuit (IC) chip will incorporate temperature-sensitive elements (e.g., temperature-sensitive devices or temperature-sensitive circuits) that can exhibit variations in one or more performance attributes as a function of temperature variations. Such temperature-sensitive elements include, but are not limited to, photonic devices and opto-electronic devices. Temperature variations of a temperature-sensitive element can be due to thermal coupling with one or more adjacent circuits. Specifically, the amount of heat radiated by components of the adjacent circuit(s) can vary, for example, as a function of operational changes (e.g., changes in frequency, data rate, etc.) and/or degradation over time and such variations in the amount of radiated heat can cause corresponding variations in the temperature of the temperature-sensitive element. In some applications, however, it is important that the performance attribute(s) of a temperature-sensitive element remain constant. Feedback techniques are typically used to control the temperature of a temperature-sensitive element and, thereby to control the value of the performance attribute of the temperature-sensitive element. For example, the temperature of the temperature-sensitive element can be sensed and, when that temperature increases above a predetermined threshold temperature, one or more actions can be taken (e.g., reducing the supply voltage to adjacent circuit(s), reducing the frequency of operation of the adjacent circuit (s), etc.) in order to reduce the temperature. Unfortunately, such feedback techniques effectively result in an oscillating temperature as opposed to a constant temperature. Therefore, there is a need in the art for an improved temperature control technique, which ensures that the temperature of a temperature-sensitive element on an integrated circuit (IC) chip remains constant throughout the useful life of that IC chip.

In view of the foregoing, disclosed herein embodiments of an integrated circuit (IC) chip incorporating a temperature-sensitive element and temperature-control circuitry for ensuring that the temperature of the temperature-sensitive element remains essentially constant through the useful life of the IC chip. Specifically, the embodiments of the IC chip can comprise a temperature-sensitive element and, within at least one region adjacent to the temperature-sensitive element, a first circuit (e.g., a functional circuit) that radiates a first heat amount to the temperature-sensitive element and a second circuit (e.g., a temperature stabilization circuit) that radiates a second heat amount to the temperature-sensitive element. The second circuit can sense changes in a first current amount in the first circuit that will cause changes in the first heat amount. Additionally, in response to those changes, the second circuit can automatically adjust a second current amount in the second circuit and can, thereby automatically adjust the second heat amount in order to ensure that the total heat amount radiated by the first circuit and the second circuit, in combination, to the temperature-sensitive element remains constant. By making adjustments to the second current amount as changes in the first current amount are sensed, the changes to the first heat amount radiated by the first circuit to the temperature-sensitive element occur essentially simultaneously with the changes to the second heat amount radiated by the second circuit to the temperature-sensitive element. Thus, the technique disclosed herein avoids oscillations in local temperature at the temperature-sensitive element. Also disclosed herein are associated methods for temperature stabilization of a temperature-sensitive element on an IC chip.

Figure 1B:
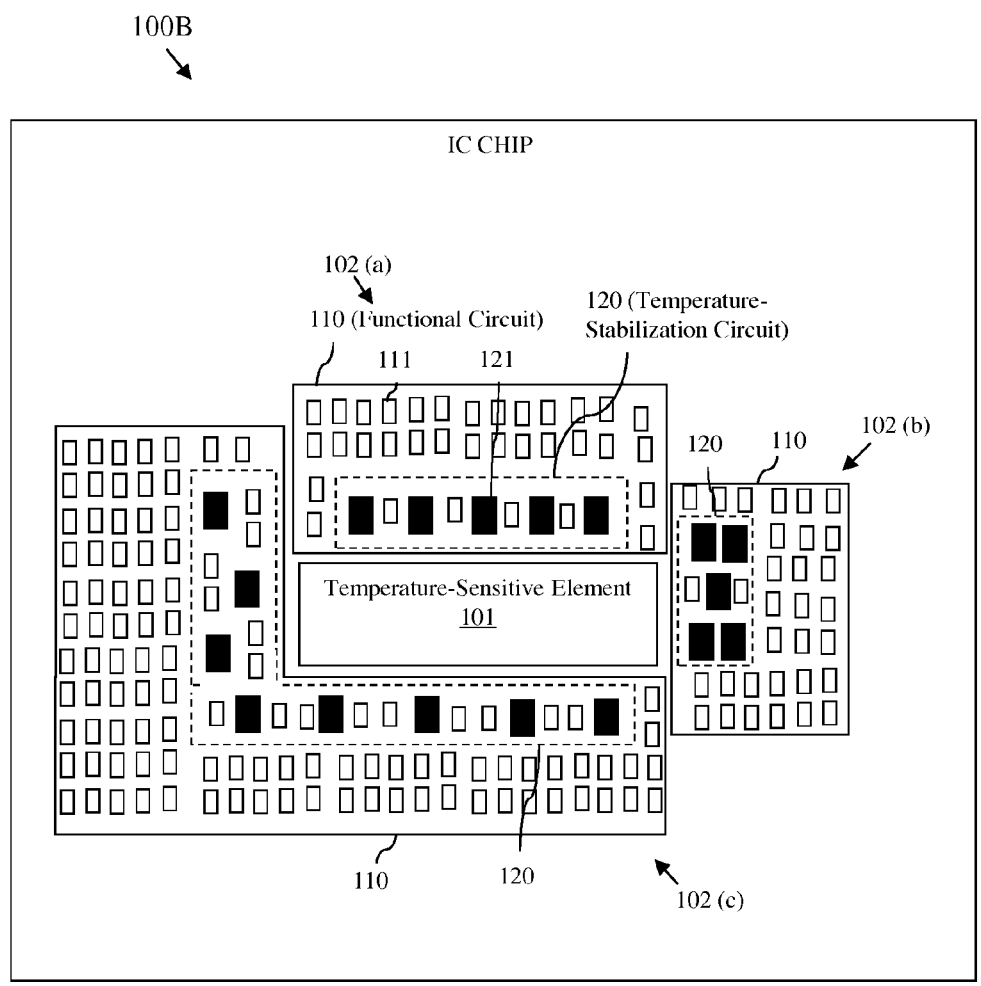
FIG. 1B is a schematic diagram illustrating another integrated circuit (IC) chip configured to provide temperature stabilization to a temperature-sensitive element.

More particularly, referring to FIGS. 1A and 1B, disclosed herein are embodiments of an integrated circuit (IC) chip 100A and 100B.

In each of the embodiments, the IC chip 100A, 100B can comprise a temperature-sensitive element 101. The temperature-sensitive element 101 can comprise any temperature-sensitive device or circuit, wherein one or more performance attributes of the device or circuit can vary with variations in temperature caused by thermally coupling with circuit(s) in adjacent region(s) of the IC chip. The temperature-sensitive element 101 can further be a device or circuit in which it is desirable for the performance attribute(s) to remain constant throughout the useful life of the IC chip. For example, the temperature-sensitive element 101 can comprise an opto-electronic device, a photonic device, an optical modulator, or any other temperature-sensitive device or circuit.

In each of the embodiments, the IC chip 100A, 100B can further comprise at least one circuit-containing region adjacent to and, particularly, bordering the temperature-sensitive element 101. For purposes of illustration, three circuit-containing regions 102(a)-(c) are shown in FIGS. 1A-1B as being adjacent to the temperature-sensitive element 101. However, it should be understood that FIGS. 1A-1B are not intended to be limiting and the IC chip 100A, 100B can comprise any number of one or more circuit-containing regions bordering the temperature-sensitive element 101.

Each circuit-containing region (e.g., 102(a)-(c)) that borders the temperature-sensitive element 101 can comprise a pair of circuits. Thus, if there are multiple circuit-containing regions (e.g., 102(a)-(c)) on an IC chip, there will be multiple pairs of circuits, respectively. In any case, each pair of circuits in each circuit-containing region that borders the temperature-sensitive element 101 can comprise a first circuit 110 and a second circuit 120 adjacent to the first circuit 110.

The first circuit 110 in each pair of circuits within a given circuit-containing region can be thermally coupled to the temperature-sensitive element 101 and can comprise any type of functional circuit. For example, the first circuit 110 can comprise a memory circuit, a processing circuit, an application-specific circuit, etc. In any case, the first circuit 110 can comprise first components 111 and wires and/or interconnects connecting those first components 111. The first components 111 can comprise passive devices, such as resistors, capacitors, inductors, diodes, etc. and/or active devices, such as transistors, silicon-controlled rectifiers, etc. The first circuit 110 and, particularly, the first components 111 thereof can radiate a first heat amount ($H_{1C}$) to the temperature-sensitive element 101 (i.e., can transfer a first heat amount ($H_{1C}$) to the temperature-sensitive element). This first heat amount ($H_{1C}$) can vary with variations in a first current amount ($I_{1C}$) that passes through the first circuit 110. This first current amount ($I_{1C}$) can vary due, for example, to changes in the mode of operation of the first circuit 110 and/or due to degradation of one or more of the first components 11 in the first circuit 110. In any case, the relationship between the first heat amount ($H_{1C}$) transferred to the temperature-sensitive element 101 and the first current amount ($I_{1C}$) can be represented by a first heating coefficient ($C_{1C}$). This first heating coefficient can be defined in terms of units of thermal energy (i.e., heat) (e.g., Joules (J)) per unit of current (e.g., in Amperes (A), in milliamperes (mA), etc.). For example, each one unit (e.g., 1 A, 1 mA, etc.) increase in the first current amount ($I_{1C}$) can cause an increase of some number y of units of thermal energy (e.g., yJ) transferred into the temperature-sensitive device, as illustrated by the following expression:

$$H_{1C} = C_{1C} * I_{1C} \quad (1)$$

Figure 2:
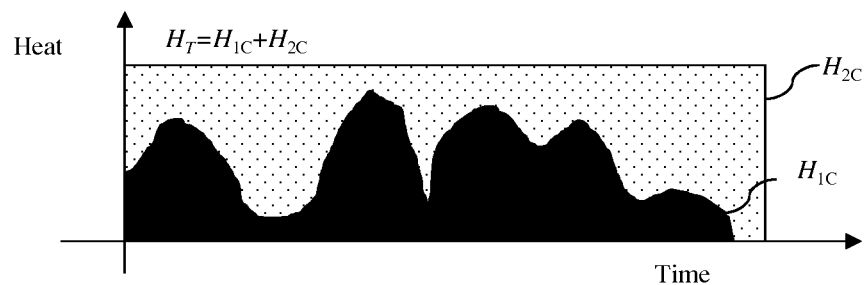
FIG. 2 is a graph illustrating counter-balancing variations in heat amounts radiated by first and second circuits in the same region of an IC chip over time such that the total heat amount radiated by those first and second circuits remains constant.

The second circuit 120 in each pair of circuits within a given circuit-containing region can also be thermally coupled to the temperature-sensitive element 101 and can comprise a temperature-stabilization circuit configured to generate heat such that a second heat amount ($H_{2C}$) is radiated to the temperature-sensitive element 101 (i.e., such that a second heat amount ($H_{2C}$) is transferred to the temperature-sensitive element 101), which will vary in order to counter-balance variations in the first heat amount ($H_{1C}$) radiated by the first circuit 110 within the same region over time such that the total heat amount ($H_T$) radiated by the first circuit 110 and the second circuit 120 to the temperature-sensitive element 101 remains constant over time, as defined by the following expression and illustrated in the graph of FIG. 2:

$$H_T = H_{1C} + H_{2C} \quad (2)$$

More specifically, the second circuit 120 can comprise second components 121 and wires and/or interconnects connecting those second components 121. The second components 121 can comprise heat generating devices including, passive devices, such as resistors, capacitors, inductors, diodes, etc. and/or active devices, such as transistors, silicon-controlled rectifiers, peltier elements, etc. The second circuit 120 and, particularly, the second components 121 thereof can generate heat such that a second heat amount ($H_{2C}$) is radiated (i.e., is transferred) to the temperature-sensitive element 101 (i.e., can be adapted to generate heat, can be configured to generate heat, etc. such that a second heat amount ($H_{2C}$) is radiated to the temperature-sensitive element 101. This second heat amount ($H_{2C}$) can vary with variations in a second current amount ($I_{2c}$) in the second circuit 120 and the relationship between the second heat amount ($H_{2C}$) transferred to the temperature-sensitive element 101 and the second current amount ($I_{2C}$) can be represented by a second heating coefficient ($C_{2C}$). This second heating coefficient ($C_{2C}$) can, like the first heating coefficient ($C_{1C}$), be defined in terms of units of thermal energy (i.e., heat) (e.g., in Joules (J)) per unit of current (e.g., in Amperes (A), in milliamperes (mA), etc.). For example, each one unit (e.g., 1 A, 1 mA, etc.) decrease in the second current amount ($I_{1C}$) can cause a decrease of some number z of units of thermal energy (e.g., zJ) transferred into the temperature-sensitive device, as illustrated by the following expression:

$$H_{2C} = C_{2C} * I_{2C} \quad (3)$$

In any case, the second circuit 120 can be operably connected to the first circuit 110 and can sense (i.e., can be adapted to sense, can be configured to sense, etc.) any changes in the first current amount ($I_{1C}$) in the first circuit 110 that will eventually cause changes in the first heat amount ($H_{1C}$). Additionally, in response to any changes sensed in the first current amount ($I_{1C}$), the second circuit 120 can automatically adjust (i.e., can be adapted to automatically adjust, can be configured to automatically adjust, etc.) the second current amount ($I_{2C}$) and, thereby can automatically adjust the second heat amount ($H_{2C}$) radiated by that second circuit 120 to the temperature-sensitive element 101 in order to ensure that the total heat amount ($H_T$) radiated by the first circuit 110 and the second circuit 120, in combination, to the temperature-sensitive element 101 remains constant. That is, as the first current amount ($I_{1C}$) and, thereby the first heat amount ($H_{1C}$) transferred by the first circuit 110 to the temperature-sensitive element 101 rises, the second circuit 120 will automatically decrease the second current amount ($I_{2C}$) and, thereby the second heat amount ($H_{2C}$) that is transferred by the second circuit 120 to the temperature-sensitive element 101 and vice versa in order to ensure that the total heat amount ($H_T$) transferred by both of the circuits 110, 120, in combination, remains constant.

Figure 3:
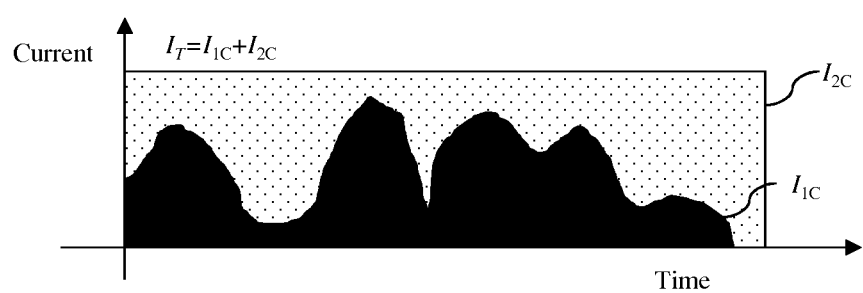
FIG. 3 is a graph illustrating counter-balancing variations in current amounts associated with first and second circuits in the same region of an IC chip over time such that the total current amount remains constant.

In one embodiment disclosed herein, the layout of the second circuit 120 can be such that the second components 121 are substantially uniformly interspersed among the first components 111 of the first circuit 110 across the entire region at issue (i.e., across the region that contains the pair of circuits 110, 120), for example, as illustrated in each of the regions 102(a)-(c) in the IC chip 100A of FIG. 1A. Thus, the total area (or total width) of the first circuit 110 and the total area (or total width) of the second circuit 120 are substantially the same. Additionally, in this embodiment, the second circuit 120 can be configured such that the ratio of the first heating coefficient ($C_{1C}$) of the first circuit 110 to the second heating coefficient ($C_{2C}$) of the second circuit 120 is a 1:1 ratio and such that, in addition to the total heat amount ($H_T$) remaining constant, the total current amount ($I_T$), which is defined by the following expression, remains constant over time as illustrated in the graph of FIG. 3:

$$I_T = I_{1C} + I_{2C}. \quad (4)$$

That is, any change in the first current amount ($I_{1C}$) will result in an equal and opposite change in the second current amount ($I_{2C}$) (i.e., $\Delta I_{1C} = -\Delta I_{2C}$). As a result, when the first current amount ($I_{1C}$) increases by some number n of units of current so that the first heat amount ($H_{1C}$) transferred by the first circuit 110 to the temperature-sensitive element 101 will increase by some amount m of units thermal energy, the second circuit 120 will automatically decrease the second current amount ($I_{2C}$) by the same number n of units of current, thereby decreasing the second heat amount ($H_{2C}$) by the same amount m of units of thermal energy. Since the change in the amount of thermal energy (i.e., the amount of heat) transferred by the first circuit 110 to the temperature-sensitive element 101 is an equal and opposite amount of thermal energy as that transferred by the second circuit 120 to the temperature-sensitive element 101 (i.e., since $\Delta H_{1C} = -\Delta H_{2C}$), the total amount of thermal energy transferred by both of the circuits 110 and 120 to the temperature-sensitive element will remain constant. This is because the components of the first circuit 110 and second circuit 120 are uniformly distributed across the same region (i.e., the first circuit 110 and second circuit 120 are essentially equal in size and, more particularly, equal in area (or width)) and because of the 1:1 ratio of the first heating coefficient (CO to the second heating coefficient ($C_{2C}$).

Figure 4:
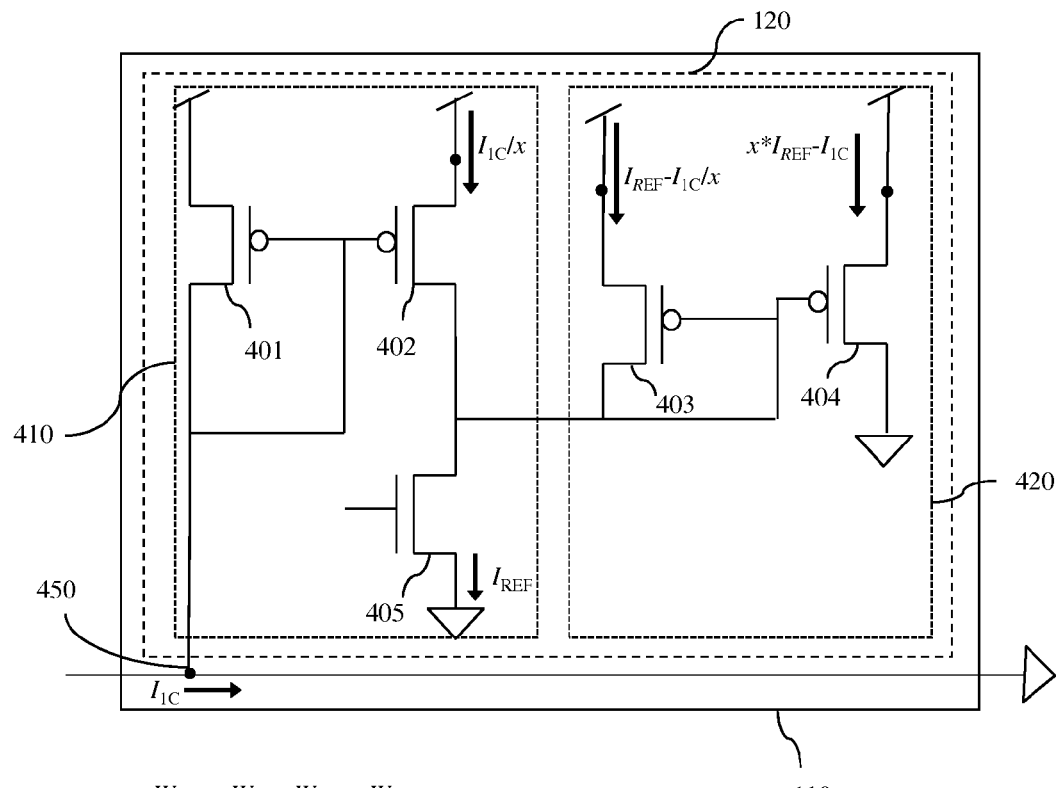
FIG. 4 is a schematic diagram illustrating an exemplary temperature-stabilization circuit that can incorporated into a circuit-containing region of the IC chip of FIG. 1A adjacent to a temperature-sensitive element to achieve a constant total current amount and a constant total heat amount.

FIG. 4 is a schematic diagram illustrating an exemplary temperature-stabilization circuit that can be used for the second circuit 120 in any one of the regions 102(a)-(c) in the IC chip 100A of FIG. 1A to achieve a constant total current amount ($I_T$) and a constant total heat amount ($H_T$). As illustrated in FIG. 4, the layout of this second circuit 120 overlays the layout of the first circuit 110 such that components of the two circuits will be substantially uniformly distributed within the same region. The temperature-stabilization circuit senses the first current amount ($I_{1C}$) through the first circuit 110 at node 450. The temperature-stabilization circuit comprises a first current mirror 410 and a second current mirror 420. The first current mirror 410 comprises a first p-type field effect transistor (PFET) 401 and a second PFET 402. The first PFET 401 can have a first channel width ($W_{401}$) and a drain region connected to the node 450 and the second PFET can have a second channel width ($W_{402}$) and a drain region connected through an n-type FET (NFET) 405 to ground. The gates of the first PFET 401 and second PFET 402 are controlled by the drain region of the first PFET 401. The second current mirror 420 comprises a third PFET 403 and a fourth PFET 404. The third PFET 403 can have a third channel width ($W_{403}$). The fourth PFET 404 can have a fourth channel width ($W_{404}$) and a drain region connected to ground. The gates of the third PFET 403 and fourth PFET 404 are controlled by the drain region of the second PFET 402, which is electrically connected to the node 450. The second channel width ($W_{402}$) can be equal to the third channel width ($W_{403}$), the first channel width ($W_{401}$) can be equal to the fourth channel width ($W_{404}$), and the first channel width ($W_{401}$) and the fourth channel width ($W_{404}$) can be some multiple (x) of the second channel width ($W_{402}$) and third channel width ($W_{403}$), respectively (i.e., $W_{401} = xW_{402} = xW_{403} = W_{404}$). In this temperature-stabilization circuit, the second current amount ($I_{2C}$) will be equal to the sum of the currents through the second PFET 402, third PFET 403 and fourth PFET 404 and can be expressed as follows:

$$I_{2C} = I_{1C}/x + (I_{REF} - I_{1C}/x) + x*I_{REF} - I_{1C}, \quad (5)$$

where $I_{REF}$ is the current through the NFET 405, $I_{1C}$ is the current through the first circuit 110, $I_{1C}/x$ is the current through the second PFET 402, $I_{REF} - I_{1C}/x$ is the current through the third PFET 403 and $x*I_{REF} - I_{1C}$ is the current through the fourth PFET 404. Thus, as the first current amount ($I_{1C}$) increases the second current amount ($I_{2C}$) decreases by an equal amount. The sizes of the PFETs 401-404 and particularly the channel widths can be predetermined to ensure the total heat amount ($H_T$) also remains constant. It should be noted that, given equation (4) above, the total current amount ($I_T$) can be simplified using the following equation:

$$I_T = (x+1)I_{REF}. \quad (6)$$

In another embodiment disclosed herein, the second components 121 of the second circuit 120 are not substantially uniformly interspersed among the first components 111 of the first circuit. As illustrated in the IC chip 100B of FIG. 1B, the second components 121 of the second circuit 120 can be located in only a portion of the region that contains the pair of circuits.

This portion can have an area (or width) that is smaller than the total area (or total width) of the region. In this case, since the second circuit 120 is located in a relatively small portion of the entire region that contains the first circuit 110, the second heating coefficient ($C_{2C}$) associated with the second circuit 120 must be higher than the first heating coefficient ($H_{1C}$) associated with the first circuit 110 and/or any change in the first current amount ($I_{1C}$) must result in a greater and opposite change in the second current amount ($I_{2C}$) (i.e., $p\Delta I_{1C} = -\Delta I_{2C}$, where p>1) in order to compensate for the smaller second circuit area. Specifically, the second current amount ($I_{2C}$) can be expressed using the following equation:

$$I_{2C} = C_{1C}/C_{2C} * (I_{1C-MAX} - I_{1C}), \quad (7)$$

where $I_{1C-MAX}$ is the maximum amount of current possible through the first circuit 110 (referred to herein as the first maximum current amount).

Figure 5:
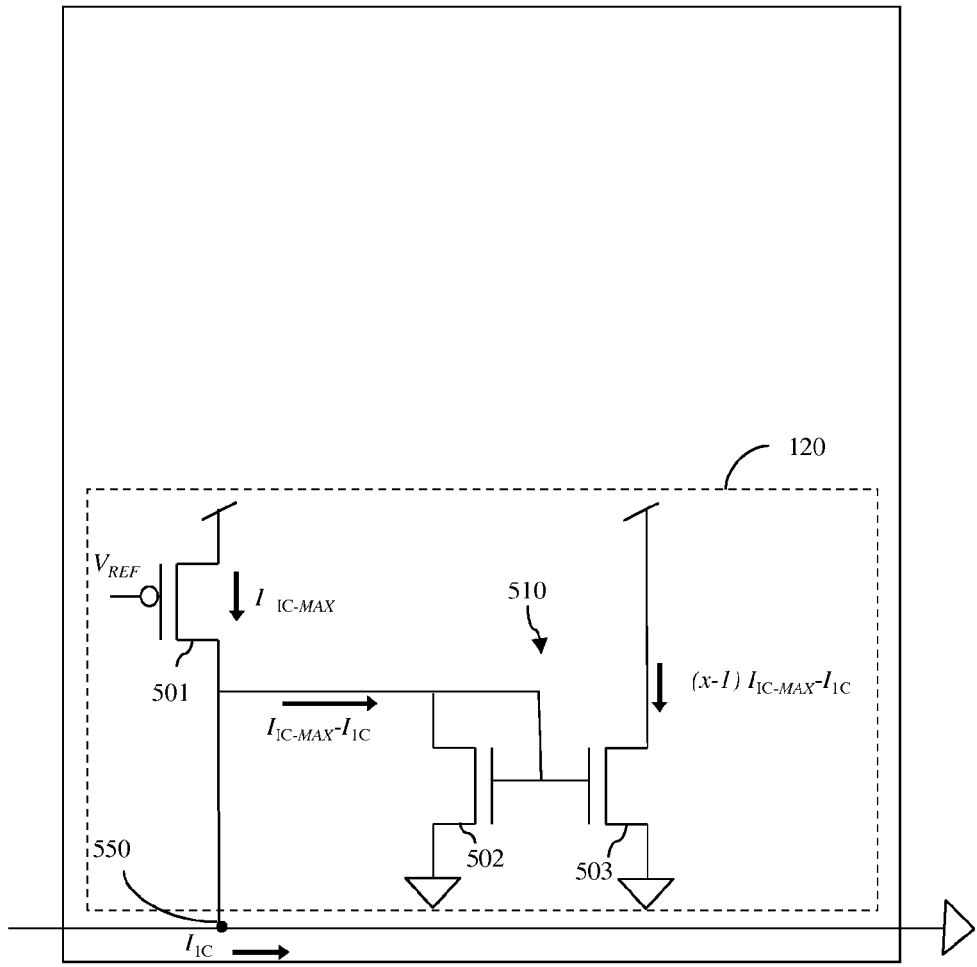
FIG. 5 is a schematic diagram illustrating an exemplary temperature-stabilization circuit that can incorporated into a circuit-containing region of the IC chip of FIG. 1B adjacent to a temperature-sensitive element to achieve a constant total heat amount.

FIG. 5 is a schematic diagram illustrating an exemplary temperature-stabilization circuit that can be used for the second circuit 120 in any one of the regions 102(a)-(c) in the IC chip 100B of FIG. 1B. As illustrated, this second circuit 120 overlays only a portion of the layout of the first circuit 110 and not the entire layout of the first circuit 110. Specifically, the temperature-stabilization circuit senses the first current amount ($I_{1C}$) through the first circuit 110 at node 550. The temperature-stabilization circuit comprises a PFET 501 having a channel width ($W_{501}$) and a current mirror 510 comprising a first NFET 502 having a channel width ($W_{502}$) and a second NFET 503 having a channel width ($W_{503}$). The PFET 501 can have a gate selectively controlled by a reference voltage (Vref), a source region connected to a supply voltage, and a drain region connected to the node 550, connected to the drain region of the first NFET 502 and further controlling the gates of the first NFET 502 and the second NFET 503 of the current mirror 510. The first NFET 502 and the second NFET 503 can each have source regions connected to ground. Finally, the second NFET 503 can have a drain region connected to the supply voltage. In this case, the reference voltage (Vref) and the widths $W_{501}$-$W_{503}$ of the channel regions of the FETs 501-503 can be selectively adjusted to achieve the desired relationship between the first current amount ($I_{1C}$) and the second current amount ($I_{2C}$). Specifically, the reference voltage (Vref) and the width ($W_{501}$) of the channel region of the PFET 501 can be selected such that the current through the PFET 501 is equal to the maximum amount of current possible through the first circuit 110 ($I_{1C\text{-}MAX}$). Additionally, the width ($W_{502}$) of the channel region of the first NFET 502 and the width ($W_{503}$) of the channel region of the second NFET 503 can be selected such that the ratio of the width ($W_{503}$) of the channel region of the second NFET 503 to the width ($W_{502}$) of the channel region of the first NFET 502 is equal to some multiple (x) minus 1, where x is equal to the ratio of the first heating coefficient ($C_{1C}$) to the second heating coefficient ($C_{2C}$). In this temperature-stabilization circuit, the total current amount ($I_T$) can be expressed as follows:

$$I_T = I_{1C\text{-}MAX} + (x-1)(I_{1C\text{-}MAX} - I_{1C}), \quad (8)$$

where $I_{1C}$ is the current through the first circuit 110 and $I_{1C\text{-}MAX}$ is the maximum amount of current possible through the first circuit 110 (referred to herein as the first maximum current amount). The total current amount ($I_T$) can further be simplified as follows:

$$I_T = I_{1C} + x(I_{1C\text{-}MAX} - I_{1C}). \quad (9)$$

Figure 6A:
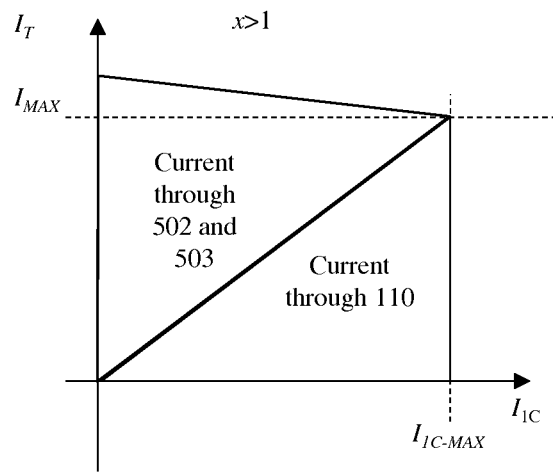
FIG. 6A is a graph illustrating an exemplary relationship between the total current amount and the current amount through the first circuit when using the temperature-stabilization circuit shown in FIG. 5.
Figure 6B:
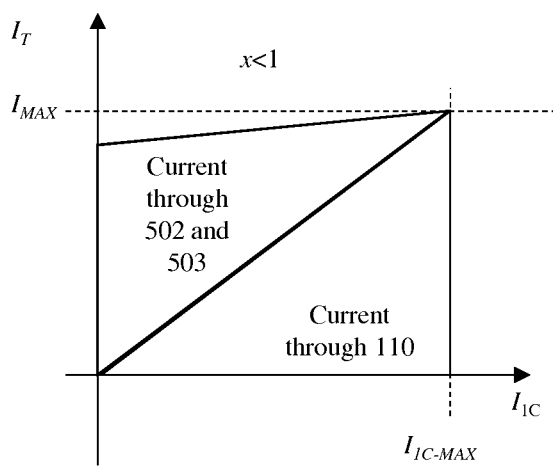
FIG. 6B is a graph illustrating an alternative exemplary relationship between the total current amount and the current amount through the first circuit when using the temperature-stabilization circuit shown in FIG. 5; and, FIG. 7 is a flow diagram illustrating a method for stabilizing the temperature of an on-chip temperature-sensitive element.

FIG. 6A is a graph illustrating the exemplary relationship between the currents passing through the NFETs 502 and 503 and through the first circuit 110 in the exemplary temperature-stabilization circuit of FIG. 5, when x (i.e., the ratio of the first heating coefficient ($C_{1C}$) to the second heating coefficient ($C_{2C}$) is greater than 1. Similarly, FIG. 6B is a graph illustrating the exemplary relationship between the currents passing through the NFETs 502 and 503 and through the first circuit 110 in the exemplary temperature-stabilization circuit of FIG. 5, when x (i.e., the ratio of the first heating coefficient ($C_{1C}$) to the second heating coefficient ($C_{2C}$) is less than 1.

It should be noted that in either of the embodiments of the IC chip 100A and 100B shown in FIGS. 1A and 1B, respectively, the second current amount ($I_{2C}$) in the second circuit 120 will be adjusted by the second circuit 120 to the maximum amount of current possible through the second circuit 120 (referred to herein as the second maximum current amount ($I_{2C\text{-}MAX}$)) when the first current amount ($I_{1C}$) is equal to zero. Conversely, the second current amount ($I_{2C}$) will be adjusted to zero when the first current amount ($I_{1C}$) is equal to the maximum amount of current possible through the first circuit 110 (referred to herein as the first maximum current amount ($I_{1C\text{-}MAX}$)). In the embodiment shown in FIG. 1A, the first maximum current amount ($I_{1C\text{-}MAX}$) will be equal to the second maximum current amount ($I_{2C\text{-}MAX}$) so that the total current amount is always constant. However, in the embodiment shown in FIG. 1B, the second maximum current amount ($I_{2C\text{-}MAX}$) may be higher than the first maximum current amount ($I_{2C\text{-}MAX}$).

Additionally, as mentioned above, in any given region 102(a)-(c) on the IC chip 100A, 100B, the first circuit 110 can comprise a functional circuit (e.g., a memory circuit, a processing circuit, etc.) and the second circuit 120 can comprise a temperature stabilization circuit. It should be understood that the temperature stabilization circuits shown in FIGS. 4 and 5 are exemplary in nature and are not intended to be limiting. Alternatively, any other suitable temperature stabilization circuit, which is specifically configured to generate and radiate a variable second heat amount ($H_{2C}$) in order to counter-balance variations in a first heat amount ($H_{1C}$) radiated by a first circuit 110 within the same region could be used as the second circuit 120. Furthermore, it should be understood that the first circuits 110 (i.e., the functional circuits) can vary from region to region (e.g., by type of functional circuit, by configuration, by layout, etc.) and each second circuit 120 (i.e., each temperature stabilization circuit) is customized based on the functional circuit within the same region. Thus, like the first circuits 110, the second circuits 120 can vary from region to region on the IC chip 100A, 100B.

Figure 7:
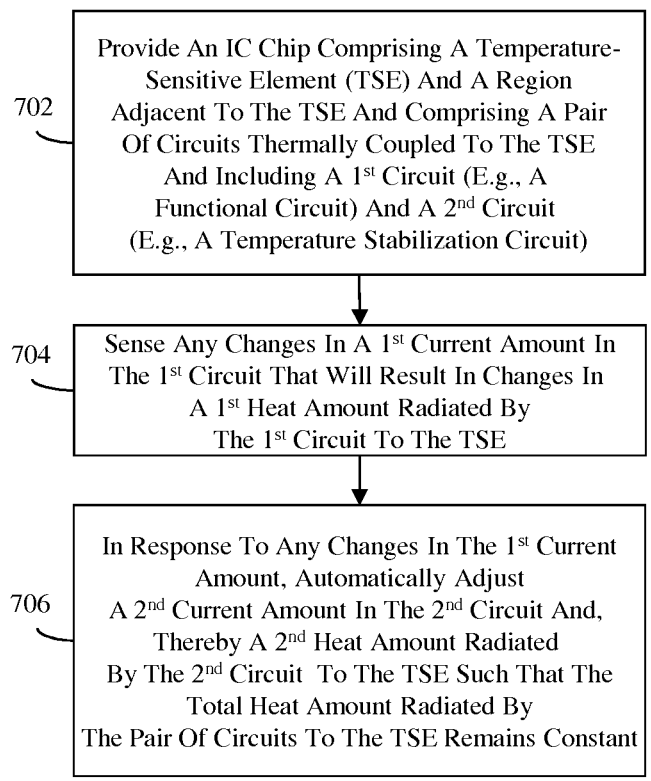

Referring to FIG. 7, also disclosed herein are embodiments of a method for stabilizing the temperature of an on-chip temperature-sensitive element. The method can comprise providing an integrated circuit (IC) chip, such as the IC chip 100A of FIG. 1A or the IC chip 100B of FIG. 1B (702). As discussed in greater detail above with regard to the circuit embodiments, the IC chip 100A, 100B can comprise a temperature-sensitive element 101 and, within each of one or more circuit-containing regions 102(a)-(c) adjacent to the temperature-sensitive element 101, a pair of circuits. Each pair of circuits in each region can comprise a first circuit 110 and a second circuit 120 adjacent to the first circuit 110. The first circuit 110 and second circuit 120 can each be thermally coupled to the temperature-sensitive element 101.

More specifically, the temperature-sensitive element 101 can comprise any temperature-sensitive device or circuit, wherein one or more performance attributes of the device or circuit can vary with variations in temperature caused by thermally coupling with circuit(s) in adjacent region(s) of the IC chip. The temperature-sensitive element 101 can further be a device or circuit in which it is desirable for the performance attribute(s) to remain constant throughout the useful life of the IC chip 100. For example, the temperature-sensitive element 101 can comprise an opto-electronic device, a photonic device, an optical modulator, or any other temperature-sensitive device or circuit.

The first circuit 110 in a given pair of circuits within a given circuit-containing region adjacent to the temperature-sensitive element 101 can comprise a functional circuit, such as a memory circuit, a processing circuit, an application-specific circuit, etc. In any case, the first circuit 110 can comprise first components 111 and wires and/or interconnects connecting those first components 111. The first components 111 can comprise passive devices, such as resistors, capacitors, inductors, diodes, etc. and/or active devices, such as transistors, silicon-controlled rectifiers, etc. The first circuit 110 and, particularly, the first components 111 thereof can radiate a first heat amount ($H_{1C}$) to the temperature-sensitive element 101 (i.e., can transfer a first heat amount ($H_{1C}$) to the temperature-sensitive element 101). This first heat amount ($H_{1C}$) can vary with variations in a first current amount ($I_{1C}$) that passes through the first circuit 110. This first current amount ($I_{1C}$) can vary due, for example, to changes in the mode of operation of the first circuit 110 and/or due to degradation of one or more of the first components 11 in the first circuit 110. In any case, the relationship between the first heat amount ($H_{1C}$) transferred to the temperature-sensitive element 101 by the first circuit 110 and the first current amount ($I_{1C}$) can be represented by a first heating coefficient ($C_{1C}$). This first heating coefficient can be defined in terms of units of thermal energy (i.e., heat) (e.g. in Joules (J)) per unit of current (e.g., in Amperes (A), in milliamperes (mA), etc.). For example, each one unit (e.g., 1 A, 1 mA, etc.) increase in the first current amount ($I_{1C}$) can cause an increase of some number y of units of thermal energy (e.g., yJ) transferred into the temperature-sensitive device, as illustrated by equation (1) above.

The second circuit 120 in a given pair of circuits within a given circuit-containing region adjacent to the temperature-sensitive element 101 can comprise a temperature-stabilization circuit configured to generate heat such that a second heat amount ($H_{2C}$) is radiated to the temperature-sensitive element 101, wherein the second heat amount ($H_{2C}$) varies in order to counter-balance variations in the first heat amount ($H_{1C}$) radiated by the first circuit 110 within the same region over time such that the total heat amount ($H_T$) radiated from that region remains constant over time, as defined by equation (2) above and illustrated in the graph of FIG. 2.

Specifically, the second circuit 120 can comprise second components 121 and wires and/or interconnects connecting those second components 121. The second components 121 can comprise heat generating devices including, passive devices, such as resistors, capacitors, inductors, diodes, etc. and/or active devices, such as transistors, silicon-controlled rectifiers, peltier elements, etc. The second circuit 120 and, particularly, the second components 121 thereof can generate heat such that a second heat amount ($H_{2C}$) is radiated to the temperature-sensitive element 101. This second heat amount ($H_{2C}$) can vary with variations in a second current amount ($I_{2C}$) in the second circuit 120 and the relationship between the second heat amount ($H_{2C}$) and the second current amount ($I_{2C}$) can be represented by a second heating coefficient ($C_{2C}$). This second heating coefficient can, like the first heating coefficient, be defined in terms of units units of thermal energy (i.e., heat) (e.g., in Joules (J)) per unit of current (e.g., in Amperes (A), in milliamperes (mA), etc.). For example, each one unit (e.g., 1 A, 1 mA, etc.) decrease in the second current amount ($I_{1C}$) can cause a decrease of some number z of units of thermal energy (e.g., zJ) transferred into the temperature-sensitive device, as illustrated by equation (3) above.

For each pair of circuits within each circuit-containing region bordering the temperature-sensitive element 101, the method can comprise sensing, by the second circuit 120, changes in a first current amount ($I_{1C}$) in the first circuit 110 (704) and, in response to any changes sensed in the first current amount ($I_{1C}$), automatically adjusting, by the second circuit 120, a second current amount ($I_{2C}$) in the second circuit 120 (706). Specifically, the first circuit 110 can radiate a first heat amount ($H_{1C}$) to the temperature-sensitive element 101 and this first heat amount ($H_{1C}$) can vary with variations in a first current amount ($I_{1C}$) through the first circuit 110. Thus, the method can comprise sensing, by the second circuit 120, any changes in the first current amount ($I_{1C}$) that will cause changes in the first heat amount ($H_{1C}$) at process 704. Additionally, the second circuit 120 can generate heat such that a second heat amount ($H_{2C}$) is radiated to the temperature-sensitive element 101 and such that the second heat amount ($H_{2C}$) varies with variations in the second current amount ($I_{2C}$) in the second circuit 120. Thus, the method can further comprise, in response to any changes sensed in the first current amount ($I_{1C}$), automatically adjusting, by the second circuit 120, the second current amount ($I_{2C}$) and, thereby automatically adjusting the second heat amount ($H_{2C}$) at process 706 in order to ensure that the total heat amount ($H_{2C}$) radiated by the first circuit 110 and the second circuit 120, in combination, to the temperature-sensitive element 101 remains constant.

In one embodiment of the method, the IC chip provided at process 702 is the IC chip 100A of FIG. 1A. As discussed above, the layout of the second circuit 120 in this IC chip 100A can be such that the second components 121 are substantially uniformly interspersed among the first components 111 of the first circuit 110 across the entire region at issue (i.e., across the region that contains the pair of circuits 110, 120). Thus, the total area (or total width) of the first circuit 110 and the total area (or total width) of the second circuit 120 are substantially the same. Additionally, the second circuit 120 can be designed such that the ratio of the first heating coefficient ($C_{1C}$) of the first circuit 110 to the second heating coefficient ($C_{2C}$) of the second circuit 120 is a 1:1 ratio. In this case, the second current amount ($I_{2C}$) can be adjusted at process 706 in a manner that ensures that the total current amount ($I_T$) of the pair of circuits, which is equal to the sum of the first current amount ($I_{1C}$) and the second current amount ($I_{2C}$), also remains constant, as defined by equation (4) and illustrated in the graph of FIG. 3. That is, the second current amount ($I_{2C}$) can be adjusted by the second circuit 120 at process 706 such that any change in the first current amount ($I_{1C}$) will result in an equal and opposite change in the second current amount ($I_{2C}$) (i.e., $\Delta I_{1C} = -\Delta I_{2C}$). As a result, when the first current amount ($I_{1C}$) increases by some number n of units of current so that the first heat amount ($H_{1C}$) transferred by the first circuit 110 to the temperature-sensitive element 101 will increase by some amount m of units thermal energy, the second circuit 120 will automatically decrease the second current amount ($I_{2C}$) by the same number n of units of current, thereby decreasing the second heat amount ($H_{2C}$) by the same amount m of units of thermal energy. Since the change in the amount of thermal energy (i.e., the amount of heat) transferred by the first circuit 110 to the temperature-sensitive element 101 is an equal and opposite amount of thermal energy as that transferred by the second circuit 120 to the temperature-sensitive element 101 (i.e., since $\Delta H_{1C} = -\Delta H_{2C}$), the total amount of thermal energy transferred by both of the circuits 110 and 120 to the temperature-sensitive element will remain constant. This is because the components of the first circuit 110 and second circuit 120 are uniformly distributed across the same region (i.e., the first circuit 110 and second circuit 120 are essentially equal in size and, more particularly, equal in area (or width)) and because of the 1:1 ratio of the first heating coefficient ($C_{1C}$) to the second heating coefficient ($C_{2C}$). See also the exemplary temperature stabilization circuit shown in FIG. 4 and the detailed description above.

In another embodiment of the method, the IC chip provided at process 702 can comprise IC chip 100B of FIG. 1B. In this IC chip 100B, the second components 121 of the second circuit 120 are not substantially uniformly interspersed among the first components 111 of the first circuit. Specifically, as illustrated in the IC chip 100B of FIG. 1B, the second components 121 of the second circuit 120 can be located in only a portion of the region that contains the pair of circuits. This portion can have an area (or width) that is smaller than the total area (or total width) of the region. In this case, since the second circuit 120 is located in a relatively small portion of the entire region that contains the first circuit 110, the second heating coefficient ($C_{2C}$) associated with the second circuit 120 must be higher than the first heating coefficient ($H_{1C}$) associated with the first circuit 110 and/or any change in the first current amount ($I_{1C}$) must result in a greater and opposite change in the second current amount ($I_{2C}$) (i.e., $p\Delta I_{1C} = -\Delta I_{2C}$, where p>1) in order to compensate for the smaller second circuit area. Thus, adjusting of the second current amount ($I_{2C}$) at process 706 can be performed based on equation (7) above. See also the exemplary temperature stabilization circuit shown in FIG. 5 and the detailed description above.

It should be noted that in each of the method embodiments described above, the second current amount ($I_{2C}$) in the second circuit 120 will be adjusted by the second circuit 120 at process 706 to the maximum amount of current possible through the second circuit 120 (referred to herein as the second maximum current amount ($I_{2C-MAX}$)) when the first current amount ($I_{1C}$) is equal to zero. Conversely, the second current amount ($I_{2C}$) will be adjusted at process 706 to zero when the first current amount ($I_{1C}$) is equal to the maximum amount of current possible through the first circuit 110 (referred to herein as the first maximum current amount ($I_{1C-MAX}$)). If the IC chip provided at process 702 is the IC chip 100A, the first maximum current amount ($I_{1C-MAX}$) will be equal to the second maximum current amount ($I_{2C-MAX}$) so that the total current amount is always constant. However, if the IC chip provided at process 702 it the IC chip 100B, the second maximum current amount ($I_{2C-MAX}$) may be higher than the first maximum current amount ($I_{2C-MAX}$).

The integrated circuit chips, as described above, can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed embodiments and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

Therefore, disclosed above are embodiments of an integrated circuit (IC) chip incorporating a temperature-sensitive element and temperature-control circuitry for ensuring that the temperature of the temperature-sensitive element remains essentially constant through the useful life of the IC chip. Specifically, the embodiments of the IC chip can comprise a temperature-sensitive element and, within at least one region adjacent to the temperature-sensitive element, a first circuit (e.g., a functional circuit) that radiates a first heat amount to the temperature-sensitive element and a second circuit (e.g., a temperature stabilization circuit) that radiates a second heat amount to the temperature-sensitive element. The second circuit can sense changes in a first current amount in the first circuit that will cause changes in the first heat amount and can, in response to those changes, automatically adjust a second current amount in the second circuit and, thereby automatically adjust the second heat amount in order to ensure that the total heat amount radiated by the first circuit and the second circuit, in combination, to the temperature-sensitive element remains constant. By making adjustments to the second current amount as changes in the first current amount are sensed, the changes to the first heat amount radiated by the first circuit to the temperature-sensitive element occur essentially simultaneously with the changes to the second heat amount radiated by the second circuit to the temperature-sensitive element. Thus, the technique disclosed herein avoids oscillations in local temperature at the temperature-sensitive element. Also disclosed above are associated methods for temperature stabilization of a temperature-sensitive element on an IC chip.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit chip comprising:
a temperature-sensitive element comprising a device having a temperature-dependent performance attribute;
a first circuit in a region immediately adjacent to said temperature-sensitive element; and,
a second circuit in said region,
said first circuit being a functional circuit of said integrated circuit chip and said second circuit being a temperature-stabilization circuit of said integrated circuit chip,
said first circuit and said second circuit being thermally coupled to said temperature-sensitive element,
said second circuit sensing changes in a first current amount in said first circuit, said first circuit radiating a first heat amount to said temperature-sensitive element and said first heat amount varying with variations in said first current amount, said second circuit further automatically adjusting a second current amount in said second circuit in response to said changes, said second circuit radiating a second heat amount to said temperature-sensitive element and said second heat amount varying with variations in said second current amount,
said second circuit performing said adjusting of said second current amount to ensure that a total heat amount radiated by said first circuit and said second circuit to said temperature-sensitive element remains constant.

2. The integrated circuit chip of claim 1,
said first circuit comprising first components, said second circuit comprising second components, and said first components and said second components being interspersed substantially uniformly within said region, and
said second circuit performing said adjusting of said second current amount to ensure that a total current amount equal to a sum of said first current amount and said second current amount remains constant.

3. The integrated circuit chip of claim 1,
said first circuit comprising first components throughout said region,
said second circuit comprising second components in only a portion of said region,
said portion being smaller than said region,
said second circuit performing said adjusting of said second current amount such that said second current amount is equal to a difference between a first maximum current amount for said first circuit and said first current amount multiplied by a ratio of a first heating coefficient for said first circuit to a second heating coefficient for said second circuit,
said first heating coefficient and said second heating coefficient each being defined in units thermal energy per units current, and
said ratio being predetermined to ensure that said total heat amount radiated by said first circuit and said second circuit to said temperature-sensitive element remains constant.

4. The integrated circuit chip of claim 3, said second current amount being adjusted to a second maximum current amount for said second circuit when said first current amount is equal to zero and said second current amount being adjusted to zero when said first current amount is equal to said first maximum current amount.

5. The integrated circuit chip of claim 1, said first circuit comprising any of a memory circuit, a processing circuit and an application-specific circuit and said temperature-sensitive element comprising any of an opto-electronic device, a photonic device and an optical modulator.

6. The integrated circuit chip of claim 2, said second components comprising any of passive devices, active devices and peltier elements.

7. The integrated circuit chip of claim 1, said first current amount varying due to any of changes in mode of operation of said first circuit and degradation of first components in said first circuit.

8. An integrated circuit chip comprising:
a temperature-sensitive element comprising a device having a temperature-dependent performance attribute; and,
pairs of circuits in different regions immediately adjacent to said temperature-sensitive element,
each pair in each region comprising:
  a first circuit thermally coupled to said temperature-sensitive element; and,
  a second circuit adjacent to said first circuit and thermally coupled to said temperature-sensitive element,
wherein, in each of said pairs, said first circuit being a functional circuit of said integrated circuit chip and said second circuit being a temperature-stabilization circuit of said integrated circuit chip,
said second circuit sensing changes in a first current amount in said first circuit, said first circuit radiating a first heat amount to said temperature-sensitive element and said first heat amount varying with variations in said first current amount,
said second circuit further automatically adjusting a second current amount in said second circuit in response to said changes,
said second circuit radiating a second heat amount to said temperature-sensitive element and said second heat amount varying with variations in said second current amount, and
said second circuit performing said adjusting of said second current amount to ensure that a total heat amount radiated by said first circuit and said second circuit to said temperature-sensitive element remains constant.

9. The integrated circuit chip of claim 8, said first circuit in one of said pairs comprising a control circuit for said temperature-sensitive element and said first circuit in others of said pairs comprising any of a memory circuit, a processing circuit and an application-specific circuit.

10. The integrated circuit chip of claim 8,
said first circuit comprising first components, said second circuit comprising second components and said first components and said second components being interspersed substantially uniformly within said region, and
said second circuit performing said adjusting of said second current amount to ensure that a total current amount equal to a sum of said first current amount and said second current amount remains constant.

11. The integrated circuit chip of claim 8,
said first circuit comprising first components throughout said region,
said second circuit comprising second components in only a portion of said region,
said portion being smaller than said region,
said second circuit performing said adjusting of said second current amount such that said second current amount is equal to a difference between a first maximum current amount for said first circuit and said first current amount multiplied by a ratio of a first heating coefficient for said first circuit to a second heating coefficient for said second circuit,
said first heating coefficient and said second heating coefficient each being defined in units thermal energy per units current, and
said ratio being predetermined to ensure that said total heat amount radiated by said first circuit and said second circuit to said temperature-sensitive element remains constant.

12. The integrated circuit chip of claim 11, said second current amount being adjusted to a second maximum current amount for said second circuit when said first current amount is equal to zero and said second current amount being adjusted to zero when said first current amount is equal to said first maximum current amount.

13. The integrated circuit chip of claim 8, said temperature-sensitive element comprising any of an opto-electronic device, a photonic device and an optical modulator.

14. The integrated circuit chip of claim 11, said second components comprising any of passive devices, active devices and peltier elements.

15. The integrated circuit chip of claim 8, said first current amount varying due to any of changes in mode of operation of said first circuit and degradation of first components in said first circuit.

16. A temperature stabilization method comprising:
sensing changes in a first current amount in a first circuit in a region of an integrated circuit chip immediately adjacent to a temperature-sensitive element comprising a device having a temperature-dependent performance attribute, said first circuit being thermally coupled to a temperature-sensitive element and radiating a first heat amount to said temperature-sensitive element, said first heat amount varying with variations in said first current amount; and
automatically adjusting a second current amount in a second circuit in said region in response to said changes, said second circuit being thermally coupled to said temperature-sensitive element and radiating a second heat amount to said temperature-sensitive element, said second heat amount varying with variations in said second current amount,
said first circuit being a functional circuit of said integrated circuit chip and said second circuit being a temperature-stabilization circuit of said integrated circuit chip, and
said automatically adjusting of said second current amount being performed to ensure that a total heat amount radiated by said first circuit and said second circuit to said temperature-sensitive element remains constant.

17. The method of claim 16,
said first circuit comprising first components, said second circuit comprising second components and said first components and said second components being interspersed substantially uniformly within said region, and
said adjusting of said second current amount being performed to ensure that a total current amount equal to a sum of said first current amount and said second current amount remains constant.

18. The method of claim 16,
said first circuit comprising first components throughout said region,
said second circuit comprising second components in only a portion of said region,
said portion being smaller than said region,
said adjusting of said second current amount being performed such that said second current amount is equal to a difference between a first maximum current amount for said first circuit and said first current amount multiplied by a ratio of a first heating coefficient for said first circuit to a second heating coefficient for said second circuit,
said first heating coefficient and said second heating coefficient each being defined in units thermal energy per units current, and
said ratio being predetermined to ensure that said total heat amount radiated by said first circuit and said second circuit to said temperature-sensitive element remains constant.

19. The method of claim 18, said second current amount being adjusted to a second maximum current amount for said second circuit when said first current amount is equal to zero and said second current amount being adjusted to zero when said first current amount is equal to said first maximum current amount.

20. The method of claim 17, said first circuit comprising any of a memory circuit, a processing circuit and an application-specific circuit, said temperature-sensitive element comprising any of an opto-electronic device, a photonic device and an optical modulator and said second components comprising any of passive devices, active devices and peltier elements.

* * * * *